US012666662B2

(12) United States Patent
Lee et al.

(10) Patent No.: US 12,666,662 B2
(45) Date of Patent: Jun. 23, 2026

(54) SEMICONDUCTOR DEVICE

(71) Applicant: POWER MASTER SEMICONDUCTOR CO., LTD., Bucheon-si (KR)

(72) Inventors: Chang Ju Lee, Bucheon-si (KR); Dong Kook Son, Bucheon-si (KR)

(73) Assignee: POWER MASTER SEMICONDUCTOR CO., LTD., Bucheon-si (KR)

( * ) Notice: Subject to any disclaimer, the term of this patent is extended or adjusted under 35 U.S.C. 154(b) by 421 days.

(21) Appl. No.: 18/124,649

(22) Filed: Mar. 22, 2023

(65) Prior Publication Data

US 2024/0136394 A1 Apr. 25, 2024
US 2024/0234494 A9 Jul. 11, 2024

(30) Foreign Application Priority Data

Oct. 25, 2022 (KR) ........................ 10-2022-0138690
Dec. 5, 2022 (KR) ........................ 10-2022-0167899

(51) Int. Cl.
H10D 62/10 (2025.01)
H10D 30/66 (2025.01)
H10P 30/22 (2026.01)

(52) U.S. Cl.
CPC ......... H10D 62/107 (2025.01); H10D 30/665 (2025.01); H10D 62/111 (2025.01); H10P 30/22 (2026.01)

(58) Field of Classification Search
CPC .. H10D 62/107; H10D 30/665; H10D 12/441; H10D 18/00; H10D 62/106;
(Continued)

(56) References Cited

U.S. PATENT DOCUMENTS 8,907,420 B2 12/2014 Saito et al.
9,865,677 B2 1/2018 Woo et al.
(Continued)

FOREIGN PATENT DOCUMENTS

CN 113078206 A * 7/2021 ........... H10D 62/111
KR 10-2018-0109801 10/2018
(Continued)

*Primary Examiner* — Shahed Ahmed
(74) *Attorney, Agent, or Firm* — LEX IP MEISTER, PLLC

(57) ABSTRACT

A semiconductor device is provided. A semiconductor device includes: a first semiconductor layer having an N conductivity type; and a second semiconductor layer formed on the first semiconductor layer and including an active region, a frame region, and a termination region, wherein the active region may include a plurality of first P pillars and first N pillars formed between the plurality of first P pillars, the frame region includes a plurality of second P pillars and second N pillars formed between the plurality of second P pillars, the termination region may include a first surface termination layer having a P conductivity type and formed to extend in a first direction, a second surface termination layer having an N conductivity type and formed to extend in the first direction under the first surface termination layer, a first low-concentration termination layer having a P conductivity type and formed to extend in the first direction under the second surface termination layer, and a second low-concentration termination layer having an N conductivity type and formed in the first direction under the first low-concentration termination layer.

6 Claims, 14 Drawing Sheets

2

(58) Field of Classification Search
CPC ............. H10D 64/112; H10D 30/0291; H10D
30/60–798; H10D 30/021–0415; H10D
84/83–859; H10D 86/40–60; H10D
62/109–111; H10D 30/655; H01L 21/266
See application file for complete search history.

(56) References Cited

U.S. PATENT DOCUMENTS

| | | | |
|---|---|---|---|
| 2017/0148870 A1 | 5/2017 | Huang et al. | |
| 2021/0066494 A1 | 3/2021 | Han et al. | |
| 2021/0296437 A1* | 9/2021 | Lee ...................... | H01L 21/266 |

FOREIGN PATENT DOCUMENTS

| | | |
|---|---|---|
| KR | 10-1982362 | 8/2019 |
| KR | 10-2021-0026533 | 3/2021 |
| KR | 10-2253692 | 5/2021 |
| KR | 10-2306123 | 9/2021 |

* cited by examiner

ML1

☑ : n-pillar mask layer
▨ : p-pillar mask layer

ML2

☑ : n-pillar mask layer
▨ : p-pillar mask layer

SEMICONDUCTOR DEVICE

CROSS-REFERENCE TO RELATED APPLICATION

This application claims priority to and the benefit of Korean Patent Application No. 10-2022-0138690 filed in the Korean Intellectual Property Office on Oct. 25, 2022, and Korean Patent Application No. 10-2022-0167899 filed in the Korean Intellectual Property Office on Dec. 5, 2022, the entire contents of which are incorporated herein by reference.

BACKGROUND OF THE DISCLOSURE

(a) Field of the Disclosure

The present disclosure relates to a semiconductor device.

(b) Description of the Related Art

A power-type metal oxide semiconductor field effect transistor (MOSFET) may be used as a switch, and requires low on-resistance, a high breakdown voltage, and a high switching speed. In particular, a super-junction MOSFET, which is a representative example of a high voltage resistance MOSFET, is a kind of Si-MOSFET, and has a high speed switching operation at relatively low power compared to an insulated gate bipolar transistor (IGBT) and a SiC-MOSFET.

By improving the fact that when the internal pressure is increased, a drift layer is thickened and thus on-resistance is increased in a planar MOSFET, the super-junction MOSFET alternately disposes a plurality of vertical PN junctions to reduce on-resistance, and a reduction of the amount of gate charge required to charge the input capacity, which is the sum of the gate-source capacity and the gate-drain capacity, can be realized.

A gate of the MOSFET is insulated from a drain and a source by a gate oxide layer, and since a PN junction is formed through a substrate between the drain and the source, parasitic capacitance exists due to the structure of the MOSFET. The parasitic capacitance may be a parameter that limits the frequency and switching speed of the super-junction MOSFET.

SUMMARY OF THE DISCLOSURE

One object to be solved is to provide a super junction semiconductor device capable of minimizing an energy loss occurring during an on/off operation.

A semiconductor device according to an embodiment includes: a first semiconductor layer having an N conductivity type; and a second semiconductor layer formed on the first semiconductor layer and including an active region, a frame region, and a termination region, wherein the active region may include a plurality of first P pillars and first N pillars formed between the plurality of first P pillars, and the frame region includes a plurality of second P pillars and second N pillars formed between the plurality of second P pillars, and the termination region may include a first surface termination layer having a P conductivity type and formed to extend in a first direction, a second surface termination layer having an N conductivity type and formed to extend in the first direction under the first surface termination layer, a first low-concentration termination layer having a P conductivity type and formed to extend in the first direction under the second surface termination layer, and a second low-concentration termination layer having an N conductivity type and formed in the first direction under the first low-concentration termination layer.

In some embodiments, the doping concentration of the first low-concentration termination layer and the doping concentration of the second low-concentration termination layer may be lower than the doping concentration of the first surface termination layer or the doping concentration of the second surface termination layer.

In some embodiments, the second surface termination layer, the first low-concentration termination layer, and the second low-concentration termination layer may be covered by the first surface termination layer.

The thickness of the first low-concentration termination layer and the thickness of the second low-concentration termination layer may be thicker than the thickness of the first surface termination layer or the thickness of the second surface termination layer.

The semiconductor device may be manufactured using a mask layer so that the distance between the centers of the first pillar mask patterns in the termination region is smaller than the distance between the centers of the first pillar mask patterns in the active region, and the distance between the centers of the second pillar mask patterns in the termination region is smaller than the distance between the centers of the second pillar mask pattern in the active region.

In some embodiments, the doping concentration of the second P pillar may increase as it approaches the upper end of the second semiconductor layer and decrease as it approaches the lower end of the second semiconductor layer, and the doping concentration of the second N pillar may increase as it approaches the upper end of the second semiconductor layer and decrease as it approaches the lower end of the second semiconductor layer.

In some embodiments, the slope that decreases as the doping concentration of the second P pillar approaches the lower part and the slope that decreases as the doping concentration of the second N pillar approaches the lower part may be the same.

A semiconductor device according to an embodiment includes: a first semiconductor layer having an N conductivity type; and a second semiconductor layer formed on the first semiconductor layer and including an active region, a frame region, and a termination region, wherein the active region includes a plurality of first P pillars and first N pillars formed between the plurality of first P pillars, and the frame region includes a plurality of second P pillars and second N pillars formed between the plurality of second P pillars, and the termination region includes a first surface termination layer having a P conductivity type and formed to extend in a first direction, a second surface termination layer having an N conductivity type and formed to extend in the first direction under the first surface termination layer, a first low-concentration termination layer having a P conductivity type and formed to extend in the first direction under the second surface termination layer, a second low-concentration termination layer having an N conductivity type and formed to extend in the first direction under the first low-concentration termination layer, a third low-concentration termination layer having a P conductivity type and formed to extend in the first direction under the second surface termination layer, and a fourth low-concentration termination layer having an N conductivity type and formed to extend in the first direction under the third low-concentration termination layer.

In some embodiments, the doping concentration of the first low-concentration termination layer, the second low-concentration termination layer, the third low-concentration termination layer, and the fourth low-concentration termination layer may be lower than the doping concentration of the first surface termination layer or the doping concentration of the second surface termination layer.

In some embodiments, the second surface termination layer, the first low-concentration termination layer, the second low-concentration termination layer, the third low-concentration termination layer, and the fourth low-concentration termination layer may be covered by the first surface termination layer.

In some embodiments, the thickness of the first low-concentration termination layer, the second low-concentration termination layer, the third low-concentration termination layer, and the fourth low-concentration termination layer may be thicker than the thickness of the first surface termination layer or the thickness of the second surface termination layer.

In some embodiments, the thickness of the first low-concentration termination layer may be thicker than the thickness of the second low-concentration termination layer.

In some embodiments, the thickness of the third low-concentration termination layer may be thinner than the thickness of the fourth low-concentration termination layer.

In some embodiments, the thickness of the first low-concentration termination layer may be the same as that of the fourth low-concentration termination layer.

In some embodiments, the thickness of the second low-concentration termination layer may be the same as that of the third low-concentration termination layer.

In some embodiments, the doping concentration of the second P pillar may increase as it approaches the upper end of the second semiconductor layer and may decrease as it approaches the lower end of the second semiconductor layer, and the doping concentration of the second N pillar may increase as it approaches the upper end of the second semiconductor layer and may decrease as it approaches the lower end of the second semiconductor layer.

In some embodiments, the slope that decreases as the doping concentration of the second P pillar approaches the lower part and the slope that decreases as the doping concentration of the second N pillar approaches the lower part may be the same.

DETAILED DESCRIPTION OF THE EMBODIMENTS

Figure 1:
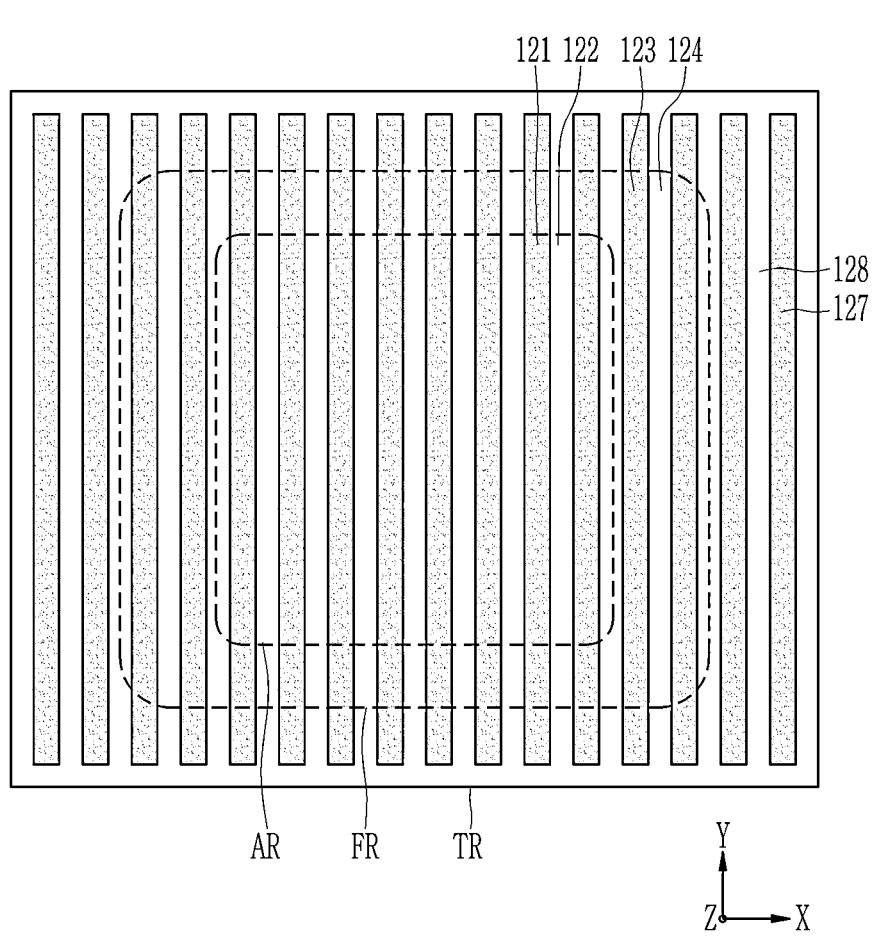
FIG. 1 is a top view to explain a semiconductor device according to an embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure. Accordingly, the drawings and description are to be regarded as illustrative in nature and not restrictive, and like reference numerals designate like elements throughout the specification.

In addition, unless explicitly described to the contrary, the word "comprise", and variations such as "comprises" or "comprising", will be understood to imply the inclusion of stated elements but not the exclusion of any other elements.

Although embodiments of the present disclosure are mainly described with an example of a super-junction semiconductor device, the technical spirit of the present disclosure is not limited thereto, and the present disclosure can be applied to other types of power switch technologies including IGBT devices, Schottky rectifiers, various types of bipolar switches, and various types of thyristors and rectifiers. In addition, although embodiments of the present disclosure are described using a specific P region and N region, the technical spirit of the present disclosure is not limited thereto, and the technical spirit of the present disclosure may also be applied to a semiconductor device having an opposite conductivity type in the corresponding region. Hereinafter, the term "semiconductor device" refers to a super-junction MOSFET and a super-junction semiconductor device, except where specifically noted.

FIG. 1 is a top view for explaining a semiconductor device according to an embodiment.

Referring to FIG. 1, a semiconductor device 1 according to an embodiment may include an active region AR, a frame region FR, and a termination region TR.

The active region AR may include a first P pillar 121 and a first N pillar 122 alternately arranged along a first direction X. That is, the active region AR may include a plurality of first P pillars 121 and the first N pillars 122 formed between a plurality of first P pillars 121.

The termination region TR may include a third P pillar 127 and a third N pillar 128 alternately arranged along the first direction X. That is, the termination region TR may include a plurality of third P pillars 127 and the third N pillars 128 formed between a plurality of third P pillars 127.

The frame region FR may correspond to a transition region disposed between the active region AR and the termination region TR. The frame region FR may include a second P pillar 123 and a second N pillars 124 alternately arranged along a first direction X). That is, the frame region FR may include a plurality of second P pillars 123 and the second N pillars 124 formed between a plurality of second P pillars 123.

The frame region FR may be formed to surround the active region AR, and the termination region TR may be formed to surround the frame region FR, but the range of the present disclosure is not limited thereto.

Such layout of the first P pillar 121 and the first N pillar 122 in the active region AR, the layout of the second P pillar 123 and the second N pillar 124 in the frame region FR, and the layout of the third P pillar 127 and the third N pillar 128 in the termination region TR are not limited to that shown in FIG. 1, and it may be variously modified according to specific implementation purposes, accordingly it may be understood that the characteristics of the semiconductor device 1 may be changed.

The semiconductor device according to embodiments described below may adopt different structures instead of the layout of the third P pillar 127 and the third N pillar 128 of the termination region TR in order to minimize an energy loss occurring during an on/off operation, and it is described with reference to FIG. 2 to FIG. 14 in detail.

Figure 2:
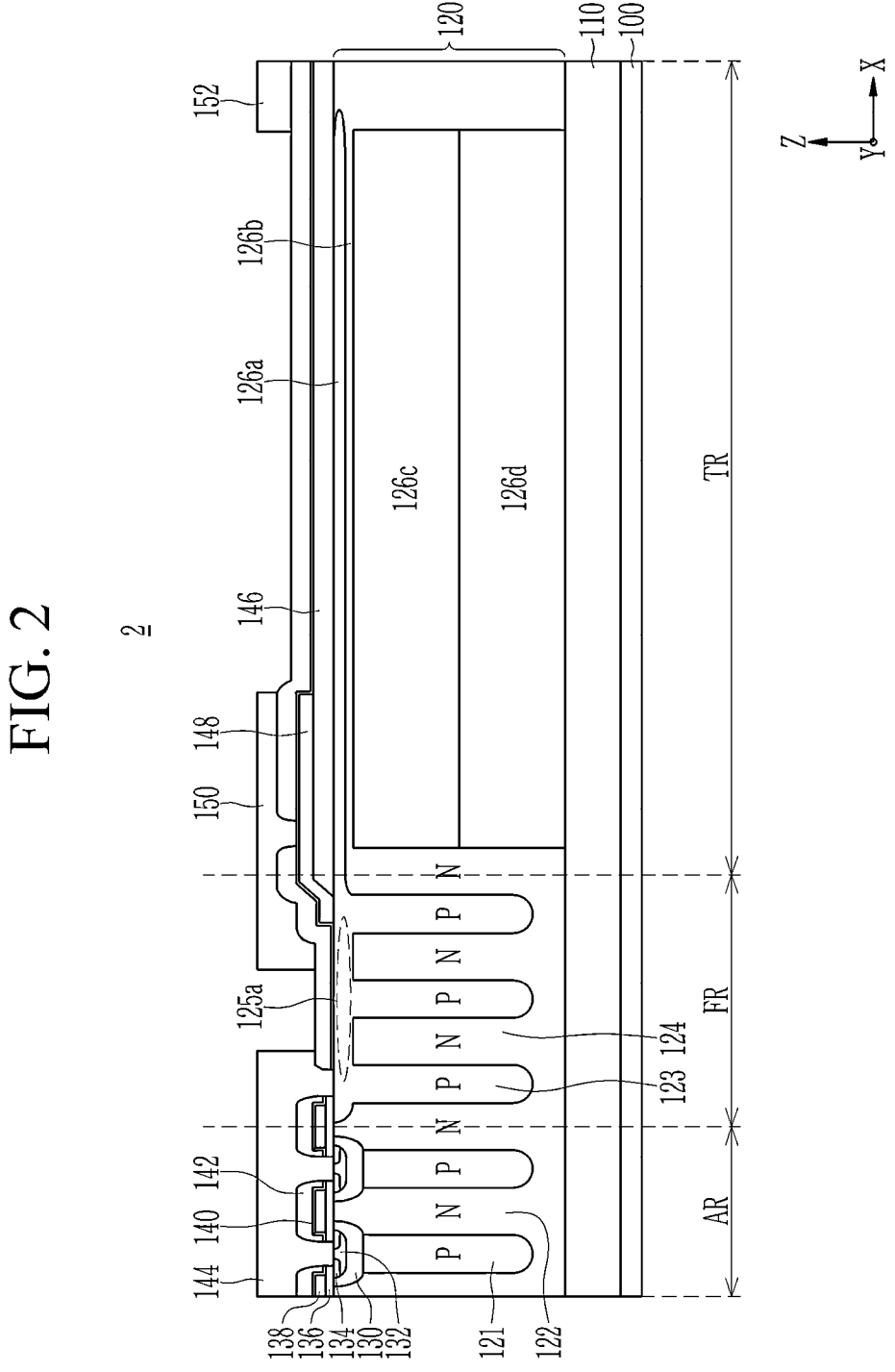
FIG. 2 is a cross-sectional view for explaining a semiconductor device according to an embodiment.

FIG. 2 is a cross-sectional view for explaining a semiconductor device according to an embodiment.

Referring to FIG. 2, a semiconductor device 2 according to an embodiment may include a first semiconductor layer 110 and a second semiconductor layer 120. Referring to FIG. 1, the aforementioned active region AR, the frame region FR, and the termination region TR may include a first semiconductor layer 110 and a second semiconductor layer 120, respectively.

The first semiconductor layer 110 is formed on the drain wiring layer 100, and referring to FIG. 1, it may be divided into the aforementioned active region AR, frame region FR, and termination region TR. The first semiconductor layer 110 may have an N conductivity type. For example, the first semiconductor layer 110 may be a portion of a semiconductor substrate doped with a high concentration of N-type impurities. Alternatively, although not shown, the first semiconductor layer 110 may refer to both a semiconductor substrate doped with high-concentration N-type impurities and an epitaxial layer doped with high-concentration N-type impurities formed on the semiconductor substrate.

The second semiconductor layer 120 is formed on the first semiconductor layer 110, and referring to FIG. 1, it may be divided into the aforementioned active region AR, frame region FR, and termination region TR.

The second semiconductor layer 120 corresponding to the active region AR may correspond to a drift layer. That is, the active region AR of the second semiconductor layer 120 may have a super junction structure in which the first P pillar 121 including the P-type impurities and the first N pillar 122 including the N-type impurities are alternately disposed along the first direction X parallel to the upper surface of the first semiconductor layer 110. That is, the active region AR of the second semiconductor layer 120 may include a plurality of first P pillars 121 and the first N pillars 122 formed between a plurality of first P pillars 121.

The first P pillar 121 and the first N pillar 122 have a predetermined width in the first direction X and may be formed to extend in a second direction Y perpendicular to the first direction X.

In some embodiments, the P-type impurity concentration of the first P pillar 121 may be the same as the N-type impurity concentration of the first N pillar 122. In addition, the width of the first direction X of the first P pillar 121 may be the same as the width of the first direction X of the first N pillar 122. Alternatively, in some other embodiments of the present disclosure, the P-type impurity concentration of the first P pillar 121 may be higher than that of the first N pillar 122, and the width of the first direction X of the first P pillar 121 may be narrower than the width of the first direction X of the first N pillar 122. Alternatively, in some other embodiments of the present disclosure, the P-type impurity concentration of the first P pillar 121 may be lower than that of the first N pillar 122, and the width of the first direction of the first P pillar 121 X may be wider than the width of the first direction X of the first N pillar 122. In any case, the impurity concentration and the width may be appropriately selected so that the balance between the P-type charge amount and the N-type charge amount included in the active region AR of the second semiconductor layer 120 may be maintained.

A P body region 130 may be formed on the first P pillar 121, and a P+ region 132 may be formed inside the P body region 130. Within the P+ region 132, two N regions 134 having a predetermined depth from the upper surface of the second semiconductor layer 120 and spaced apart from each other may be formed.

A gate dielectric layer 136 may be formed on the first N pillar 122, and an active poly gate 138 may be formed on the gate dielectric layer 136. A spacer 140 may be conformally formed on the active poly gate 138, and the spacer 140 may include, for example, a silicon nitride. An insulation layer 142 may be formed on the spacer 140. A source electrode 144 may be formed on the insulation layer 142, and the source electrode 144 may be electrically connected with the P+ region 132 by contacting the same.

A structure formed on the first P-pillar 121 and the first N-pillar 122 may not be limited to the above-described structure, and may be modified depending on specific implement purposes.

In the present embodiment, the doping concentration (or the charge amount due to the doping) of the first P pillar 121 may increase as it approaches the top of the second semiconductor layer 120 and decrease as it approaches the bottom of the second semiconductor layer 120. That is, the doping concentration of the upper region of the first P pillar 121 may be higher than that of the lower region of the first pillar 121. The doping profile of the first P pillar 121 may not necessarily have a form in which the doping concentration decreases linearly within the first P pillar 121. For example, while the doping concentration within the first P pillar 121 is changed in a ripple shape, a doping profile may appear in a shape that decreases as the overall trend or average doping concentration approaches the bottom.

Similarly, the doping concentration (or the charge amount due to the doping) of the first N pillar 122 may increase as it approaches the top of the second semiconductor layer 120 and decrease as it approaches the bottom of the second semiconductor layer 120. That is, the doping concentration of the upper region of the first N pillar 122 may be higher than that of the lower region of the first N pillar 122. The doping profile of the first N pillar 122 may not necessarily be in a form in which the doping concentration decreases linearly within the first N pillar 122. For example, in the first N pillar 122, while the doping concentration changes in the form of a ripple, and the doping profile may appear as a shape in which the overall trend or average doping concentration decreases as it approaches the bottom.

In some embodiments, a slope that decreases as the doping concentration of first P pillar 121 approaches the bottom and a slope that decreases as the doping concentration of first N pillar 122 approaches the bottom may be the same or substantially the same. Accordingly, the active region AR may balance the charge amount.

In some embodiments, the ripple-shaped doping profile with the decreasing trend as the doping concentration of the first P pillar 121 approaches the bottom and the ripple-shaped doping profile with the decreasing trend as the doping concentration of the first N pillar 122 approaches the bottom may be identical or substantially identical. Accordingly, the active region AR may balance the charge amount.

As described above in relation to FIG. 1, the frame region FR of the second semiconductor layer 120 may be formed to surround the active region AR of the second semiconductor layer 120.

The frame region FR of the second semiconductor layer 120 may include a second P pillar 123 and a second N pillar 124 alternately disposed along the first direction X parallel to the upper surface of the first semiconductor layer 110. That is, the frame region FR of the second semiconductor layer 120 may include a plurality of second P pillars 123 and second N pillars 124 formed between a plurality of second P pillars 123.

The second P pillar 123 and the second N pillar 124 have a predetermined width in the first direction X and may be formed to extend in the second direction Y perpendicular to the first direction X.

In some embodiments, the width and impurity concentration of the second P pillar 123 and second N pillar 124 in the first direction X may be the same as the width and impurity concentration of the first P pillar 121 and the first N pillar 122 in the first direction X in the active region AR. Alternatively, the width and impurity concentration of the second P pillar 123 and the second N pillar 124 in the first direction X may be formed differently from the width and impurity concentration of the first P pillar 121 and the first N pillar 122 in the first direction X in the active region AR, and the impurity concentration and width may be appropriately selected so that the balance between the P-type charge amount and the N-type charge amount included in the frame region FR may be maintained.

A spacer 140 and an insulating layer 142 may be formed on the second semiconductor layer 120 in the frame region FR. At least a portion of the insulating layer 142 may correspond to a region in which the source electrode 144 and the gate electrode 150 are not formed. That is, the source electrode 144 and the gate electrode 150 may be formed apart from each other. In the frame region FR, a region forming an electrical connection by being in contact with the source electrode 144 may exist on the second semiconductor layer 120.

The structure formed on the second semiconductor layer 120 in the frame region FR is not limited to the above structure and may be modified according to specific implementation purposes. For example, a field oxide layer 146 may be additionally formed before the insulating layer 142 is formed, or the spacer 140 may be formed in a different shape from that shown in FIG. 2.

In the present embodiment, the second P pillar 123 may be connected to the upper surface of the second semiconductor layer 120. Accordingly, a plurality of second P pillars 123 may be in contact with the source electrode 144 through the upper surface of the second semiconductor layer 120 to form an electrical connection.

Meanwhile, in the present embodiment, at least some of a plurality of second P pillars 123 may be electrically connected to each other while sharing the upper frame region 125a above the second semiconductor layer 120. That is, the upper frame region 125a may have the P conductivity type and may be formed to extend in the first direction X. For example, three second P pillars 123 may be connected to each other while sharing the upper frame region 125a, and may have the same shape as shown in FIG. 2, but the number and specific shape of the second P pillar 123 are not limited to that shown in FIG. 2 and may vary.

In the present embodiment, the doping concentration (or the amount of the charge due to the doping) of the second P pillar 123 may increase as it approaches the top of the second semiconductor layer 120 and decrease as it approaches the bottom of the second semiconductor layer 120. That is, the doping concentration of the upper region of the second P pillar 123 may be higher than that of the lower region of the second pillar 123. The doping profile of the second P pillar 123 may not necessarily have a form in which the doping concentration decreases linearly within the second P pillar 123. For example, in the second P pillar 123, while the doping concentration changes in the form of a ripple, and the doping profile may appear as a shape that decreases as the overall trend or average doping concentration approaches the bottom.

Similarly, the doping concentration (or the charge amount due to the doping) of the second N pillar 124 may increase as it approaches the upper end of the second semiconductor layer 120 and may decrease as it approaches the lower end of the second semiconductor layer 120. That is, the doping concentration of the upper region of the second N pillar 124 may be higher than that of the lower region of the second N pillar 124. The doping profile of the second N pillar 124 may not necessarily have a form in which the doping concentration decreases linearly within the second N pillar 124. For example, in the second N pillar 124, while the doping concentration changes in the form of a ripple, the doping profile may appear as a shape that decreases as the overall trend or average doping concentration approaches the bottom.

In some embodiments, a slope that decreases as the doping concentration of the second P-pillar 123 approaches the bottom and a slope that decreases as the doping concentration of the second N-pillar 124 approaches the bottom are the same or can substantially be the same. Accordingly, the frame region FR may balance the charge amount.

In some embodiments, the ripple-shaped doping profile with the decreasing trend as the doping concentration of the second P pillar 123 approaches the bottom and the ripple-shaped doping profile with the decreasing trend as the doping concentration of the second N pillar 124 approaches the bottom may be identical or substantially identical. Accordingly, the frame region FR may balance the amount of charge.

As described above in relation to FIG. 1, the termination region TR of the second semiconductor layer 120 may be formed to surround the frame region FR of the second semiconductor layer 120.

The termination region TR of the second semiconductor layer 120 may include a first surface termination layer 126a, a second surface termination layer 126b, a first low-concentration termination layer 126c, and a second low-concentration termination layer 126d.

The first surface termination layer 126a may have a P conductivity type and may be formed to extend in the first direction X. The second surface termination layer 126b has the N conductivity type and is formed to extend in the first direction X, and may be formed below the first surface termination layer 126a. In some embodiments, the doping concentration of the first surface termination layer 126a and the doping concentration of the second surface termination layer 126b may be the same or substantially the same. In the stacked structure of the first surface termination layer 126a and the second surface termination layer 126b, an upper region corresponding to the first surface termination layer 126a may correspond to a P-rich region, and a lower region corresponding to the second surface termination layer 126b may correspond to an N-rich region.

Note that the first surface termination layer 126a has a P conductivity type, and the upper surface of the first surface termination layer 126a corresponds to the upper surface of the second semiconductor layer 120. That is, as described later, the upper surface of the first surface termination layer 126a is formed to contact with the lower surface of a field oxide layer 146. The first surface termination layer 126*a* is formed to fully cover the first low-concentration termination layer 126*c* and the second low-concentration termination layer 126*d* from the top.

The conductivity type of the first surface termination layer 126*a* is closely related to the breakdown voltage of the semiconductor device 2. If the first surface termination layer 126*a* does not have enough length in the first direction X to fully cover the first low-concentration termination layer 126*c* and the second low-concentration termination layer 126*d*, the electric field distribution of the termination region TR will be distorted and the breakdown voltage decreases, so it is impossible to reach the desired performance goal. Also, as an extreme case, if the upper surface of the second semiconductor layer 120 is formed in a N conductivity type, the decrease of the breakdown voltage will increase significantly. According to experimental results, when the P-type doping concentration is decreased by 30% for the first surface termination layer 126*a*, the breakdown voltage is decreased by 32 V from 696 V (−4.6%); and when the P type doping concentration is decreased by 45% the first surface termination layer 126*a*, the breakdown voltage is decreased by 215 V from 696 V (−30.89%). Here, 696 V is the breakdown voltage when the P-type doping concentration is not decreased. Therefore, in order to satisfy the target performance, it is necessary for the first surface termination layer 126*a* to be doped with a sufficient concentration of P type, and have enough length in the first direction X to fully cover the first low-concentration termination layer 126*c* and the second low-concentration termination layer 126*d*.

The first low-concentration termination layer 126*c* has a P conductivity type and is formed to extend in the first direction X, and may be formed below the second surface termination layer 126*b*. The second low-concentration termination layer 126*d* has an N conductivity type and is formed to extend in the first direction X, and may be formed below the first low-concentration termination layer 126*c*. In some embodiments, the doping concentration of the first low-concentration termination layer 126*c* and the doping concentration of the second low-concentration termination layer 126*d* may be the same or substantially the same. In the stacked structure of the first low-concentration termination layer 126*c* and the second low-concentration termination layer 126*d*, an upper region corresponding to the first low-concentration termination layer 126*c* may correspond to a P-rich region, and a lower region corresponding to the second low-concentration termination layer 126*d* may correspond to an N-rich region.

In some embodiments, the doping concentration of the first low-concentration termination layer 126*c* may be lower than the doping concentration of the first surface termination layer 126*a* or the doping concentration of the second surface termination layer 126*b*. Also, the doping concentration of the second low-concentration termination layer 126*d* may be lower than the doping concentration of the first surface termination layer 126*a* or the doping concentration of the second surface termination layer 126*b*.

In some embodiments, the doping concentration of the first low-concentration termination layer 126*c* and the second low-concentration termination layer 126*d* may be 1e+15 cm$^{-3}$ or less, respectively.

In some embodiments, the maximum doping concentration of the first surface termination layer 126*a* and the maximum doping concentration of the second surface termination layer 126*b* are 1e+15 cm$^{-3}$ or more, respectively, the doping concentration of the first low-concentration termination layer 126*c* may be lower than the maximum doping concentration of the first surface termination layer 126*a* or the maximum doping concentration of the second surface termination layer 126*b*, and the doping concentration of the second low-concentration termination layer 126*d* may be lower than the maximum doping concentration of the first surface termination layer 126*a* or the maximum doping concentration of the second surface termination layer 126*b*.

In some embodiments, among the first surface termination layer 126*a*, the second surface termination layer 126*b*, and the first low-concentration termination layer 126*c*, the maximum doping concentration of the first surface termination layer 126*a* may be the highest, the maximum doping concentration of the first low-concentration termination layer 126*c* may be the lowest, and the maximum doping concentration of the second surface termination layer 126*b* may be in the middle.

In the termination region TR, a field oxide layer 146 may be formed on the second semiconductor layer 120, and a spacer 140 and an insulating layer 142 may be formed on the field oxide layer 146. Particularly, in the termination region TR, in some regions on the second semiconductor layer 120, a field plate 148 may be formed on the field oxide layer 146, and a spacer 140 and an insulating layer 142 may be formed on the field plate 148. A gate electrode 150 may be formed on the insulating layer 142, and the gate electrode 150 may form a contact with the field plate 148 to be electrically connected thereto.

Meanwhile, a floating electrode 152 may be formed on the field oxide layer 146 to be spaced apart from the gate electrode 150. The floating electrode 152 may function as a field stop layer that stops an electric field by being positioned at the end of the termination region TR. Here, the floating electrode 150 is referred to as s floating electrode 150 in the sense that it is not connected to the outer terminal of the chip including the semiconductor device 2, but it does not mean that the floating electrode 150 is electrically floating. For example, it may be in electrical contact with a silicon (Si) region formed in a partial region of the chip of the floating electrode 150.

Of course, the structure formed on the second semiconductor layer 120 in the termination region TR is not limited to the above structure and may be modified according to specific implementation purposes.

In the present embodiment, the first surface termination layer 126*a* may be connected to the upper frame region 125*a* of the frame region FR. Accordingly, the first surface termination layer 126*a* may be electrically connected to a plurality of second P pillars 123 of the frame region FR or in contact with the source electrode 144 through the upper surface of the semiconductor layer 120 to form an electrical connection.

In some embodiments, the impurity concentration of the upper frame region 125*a* of the frame region FR may be higher than that of the first surface termination layer 126*a*. That is, both the upper frame region 125*a* and the first surface termination layer 126*a* of the frame region FR are doped with the P-type impurity, but the upper frame region 125*a* of the frame region FR may be doped with the higher concentration of the P-type impurity. However, the scope of the present disclosure is not limited thereto.

In the present embodiment, the upper surface of the second surface termination layer 126*b* may be spaced apart from the upper surface of the second semiconductor layer 120. That is, the upper surface of the second surface termination layer 126*b* may be spaced apart from the lower surface of the field oxide layer 146. The lower surface of the first surface termination layer 126a and the upper surface of the second surface termination layer 126b may form a PN junction.

In the present embodiment, the second surface termination layer 126b, the first low-concentration termination layer 126c, and the second low-concentration termination layer 126d may be covered by the first surface termination layer 126a. That is, the first surface termination layer 126a may be formed to entirely cover the upper surface of the termination region TR.

In some embodiments, the thickness of the first low-concentration termination layer 126c may be thicker than the thickness of the first surface termination layer 126a or the thickness of the second surface termination layer 126b. Also, the thickness of the second low-concentration termination layer 126d may be thicker than the thickness of the first surface termination layer 126a or the thickness of the second surface termination layer 126b.

In some embodiments, thickness of the first low-concentration termination layer 126c may be the same or substantially the same as the thickness of the second lightly-concentrated termination layer 126d.

In the present embodiment, the termination region TR, instead of the layout of the third P pillar 127 and the third N pillar 128 described in FIG. 1, may adapt the layout of the first surface termination layer 126a, the second surface termination layer 126b, the first low-concentration termination layer 126c, and the second low-concentration termination layer 126d stacked vertically to each other, and accordingly, it is possible to minimize the energy loss that occurs during the on/off operation of the semiconductor device.

Figure 3:
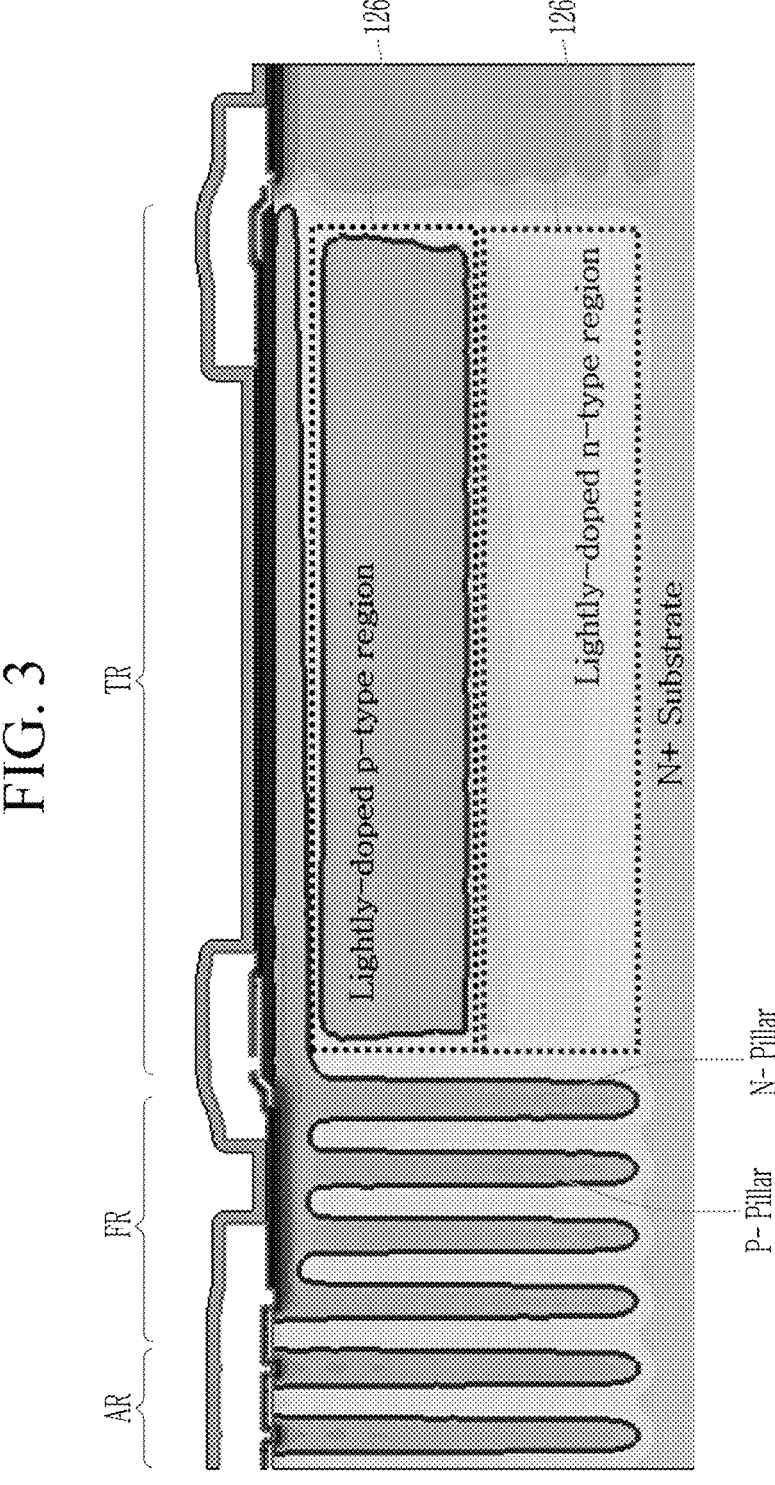
FIG. 3 and FIG. 4 are views for explaining a semiconductor device according to an embodiment.
Figure 4:
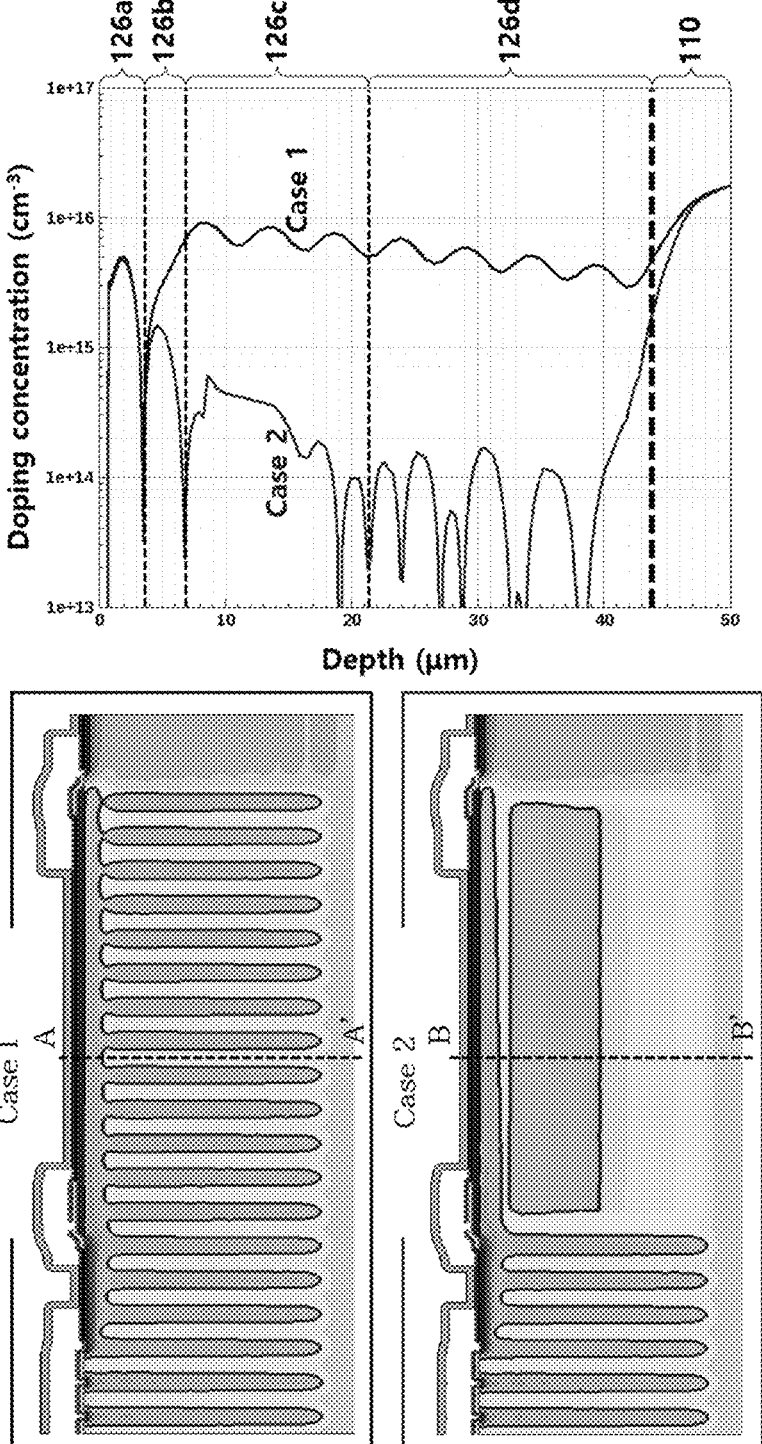

FIG. 3 and FIG. 4 are views for explaining a semiconductor device according to an embodiment.

Referring to FIG. 3, in one implementation example of the semiconductor device 2 described in relation to FIG. 2, a first semiconductor layer 110 may be formed as an N+ substrate, a first low-concentration termination layer 126c may be formed as a low-concentration P-type (a lightly-doped P-type) region, and the second low-concentration termination layer 126d may be formed as a low-concentration N-type (a lightly-doped N-type) region.

Referring to FIG. 4, "Case 1" represents a semiconductor device in which the P pillar and the N pillar are alternately arranged along the first direction X in the termination region TR, and "Case 2" represents a semiconductor device described in relation to FIG. 2. Also, a graph shown on the right represents the doping concentration depending on the depth at the position (in detail, the position corresponding to the first surface termination layer 126a, the second surface termination layer 126b, the first low-concentration termination layer 126c, the second low-concentration termination layer 126d, and the first semiconductor layer 110) according to a line AA' of the semiconductor device of "Case 1", and the "Case 2" represents the doping concentration depending on the depth at the position according to the line BB' of the semiconductor device.

Figure 5:
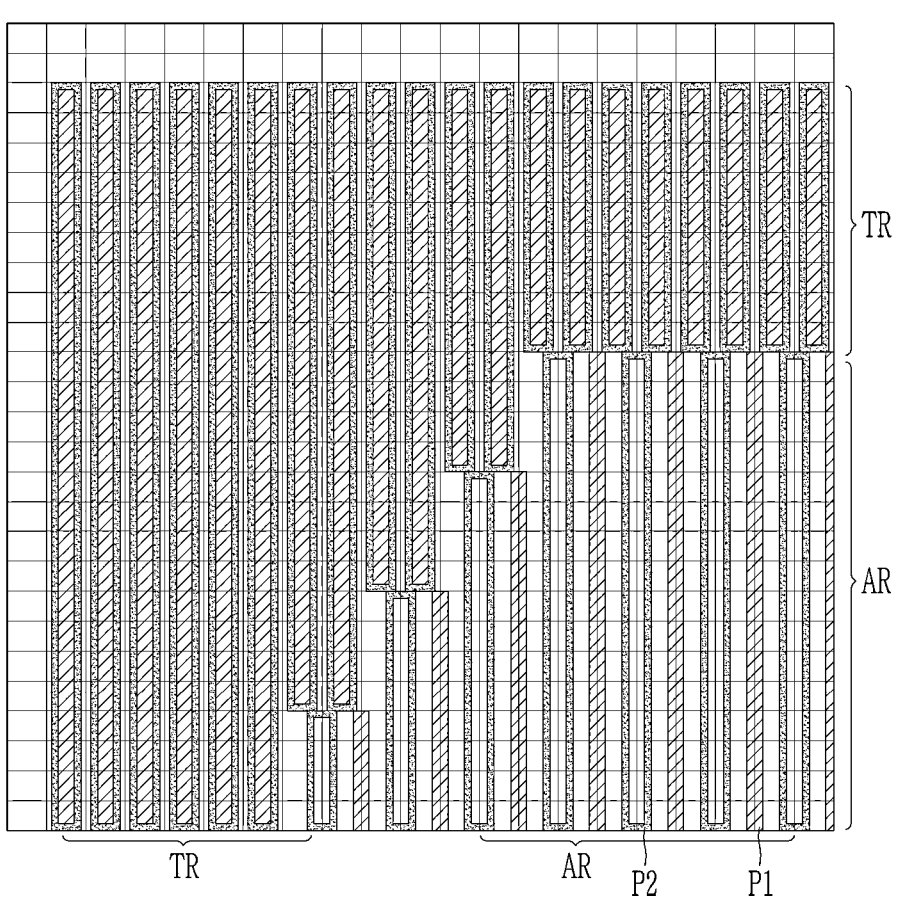
FIG. 5 and FIG. 6 are views for explaining examples of a mask layer for manufacturing a semiconductor device according to an embodiment.
Figure 6:
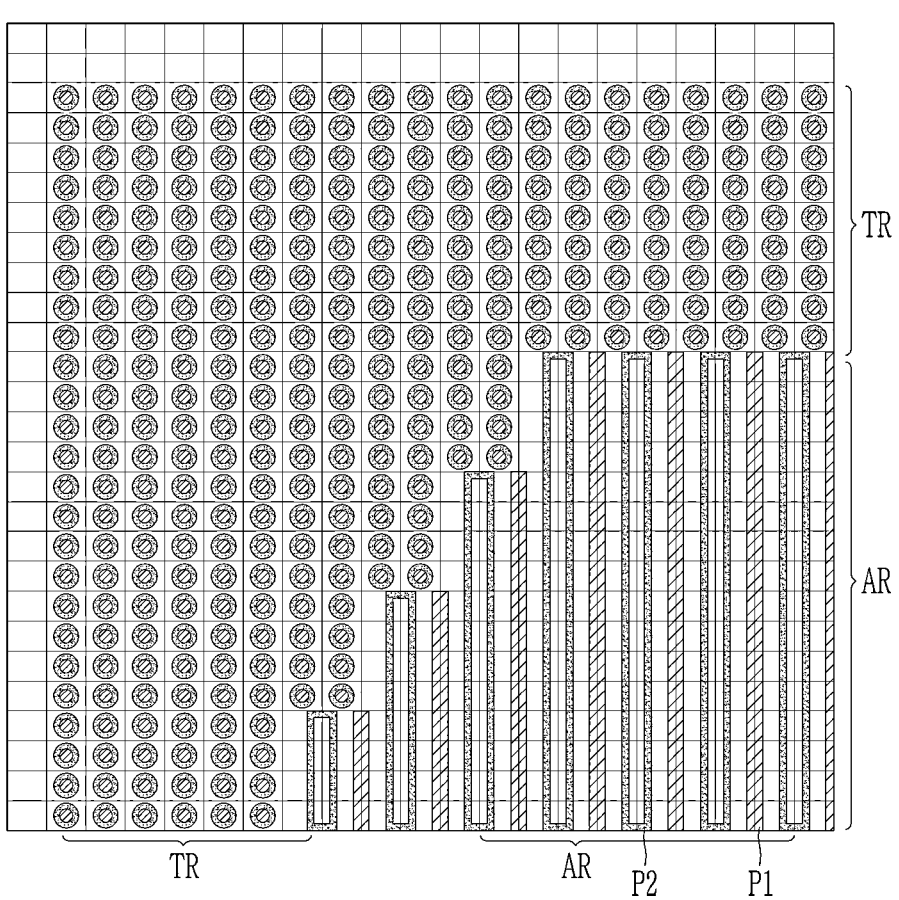

FIG. 5 and FIG. 6 are views for explaining examples of a mask layer for manufacturing a semiconductor device according to an embodiment.

Referring to FIG. 5, a mask layer ML1 for manufacturing a semiconductor device according to an embodiment may include an active region AR and a termination region TR.

The mask layer ML1 may include a first pillar mask pattern P1 and a second pillar mask pattern P2.

The first pillar mask pattern P1 may be a pattern to inject a P-type impurity into an epitaxial layer to form a first P pillar 121 formed in the active region AR, and a first surface termination layer 126a, a first low-concentration termination layer 126c, and a second low-concentration termination layer 126d formed in the termination region TR.

The second pillar mask pattern P2 may be a pattern to inject an N-type impurity into an epitaxial layer to form a first N pillar 122 formed in the active region AR, and a second surface termination layer 126b and a second low-concentration termination layer 126d formed in the termination region TR.

The region injected with the P-type impurity and the region injected with the N-type impurity are different in the active region AR, but the region injected with the P-type impurity and the region injected with the N-type impurity in the termination region TR may be the same. That is, in the active region AR, the first pillar mask pattern P1 and the second pillar mask pattern P2 may be formed in the different regions that do not overlap each other, but in the termination region TR, the first pillar mask pattern P1 and the second pillar mask pattern P2 may be formed at the same position.

The distance (a pitch) between the centers of the first pillar mask pattern P1 in the termination region TR may be smaller than the distance between the centers of the first pillar mask pattern P1 in the active region AR, and the distance between the centers of the second pillar mask pattern P2 in the termination region TR may be smaller than the distance between the centers of the second pillar mask pattern P2 in the active region AR.

In the present embodiment, first pillar mask pattern P1 and the second pillar mask pattern P2 of the termination region TR on the mask layer ML1 are formed in a straight line shape, and the first pillar mask pattern P1 and the second pillar mask pattern P2 of the active region AR may also be formed in a straight line shape.

Referring to FIG. 6, a mask layer ML2 for manufacturing a semiconductor device according to an embodiment may include an active region AR and a termination region TR.

The mask layer ML2 may include a first pillar mask pattern P1 and a second pillar mask pattern P2.

The first pillar mask pattern P1 may be a pattern used to inject a P-type impurity into an epitaxial layer to form a first P pillar 121 formed in the active region AR, and a first surface termination layer 126a, a first low-concentration termination layer 126c, and a second low-concentration termination layer 126d formed in the termination region TR.

The second pillar mask pattern P2 may be a pattern used to inject an N-type impurity into the epitaxial to form a first N pillar 122 formed in the active region AR, and a second surface termination layer 126b and a second low-concentration termination layer 126d formed in the termination region TR.

In the active region AR, the region injected with the P-type impurity and the region injected with the N-type impurity may be different, but in the termination region TR, the region injected with the P-type impurity and the region injected with the N-type impurity may be the same. That is, in the active region AR, the first pillar mask pattern P1 and the second pillar mask pattern P2 may be formed in different regions that do not overlap each other, but in the termination region TR, the first pillar mask pattern P1 and the second pillar mask pattern P2 may be formed in the same position.

The distance (a pitch) between the centers of the first pillar mask pattern P1 in the termination region TR may be smaller than the distance between the centers of the first pillar mask pattern P1 in the active region AR, and the distance between the centers of the mask pattern P2 in the termination region TR may be smaller than the distance between the centers of the second pillar mask pattern P2 in the active region AR.

In the present embodiment, the first pillar mask pattern P1 and the second pillar mask pattern P2 of the termination region TR are formed in a circular shape on the mask layer ML1, and the first pillar mask pattern P1 and the second pillar mask pattern P2 of the active region AR may also be formed in a straight line shape.

Figure 7:
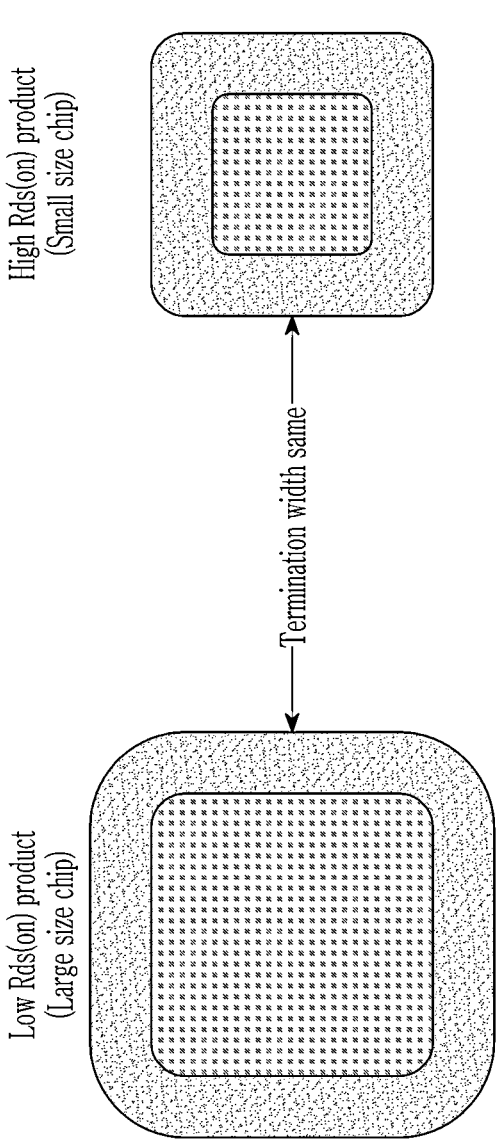
FIG. 7 is a view for explaining an effect of reducing an energy loss of a semiconductor device according to embodiments.

FIG. 7 is a view for explaining an effect of reducing an energy loss of a semiconductor device according to embodiments.

Referring to FIG. 7, even if the size of the semiconductor chip is reduced, since the width of the edge termination region remains the same, compared to Low Rds(on) products with larger chip sizes, High Rds(on) products with smaller chip sizes may increase the proportion occupied with the termination regions in the entire chip region. That is, when the size of the chip is reduced, the effect of reducing the termination region is less than the effect of reducing the active region, so the effect of reducing an Edyn may be expected. Table 1 below shows the Edyn depending on the chip size.

| Device Rds(on) [mΩ] | 180 | 280 | 380 | 600 | 1200 |
|---|---|---|---|---|---|
| Edyn [μJ]   Active | 2.40 | 1.51 | 1.13 | 0.70 | 0.36 |
| Termination (Case 1) | 0.80 | 0.67 | 0.61 | 0.50 | 0.38 |
| Termination (Case 2) | 0.10 | 0.08 | 0.07 | 0.06 | 0.05 |
| Total (Case 1) | 3.20 | 2.18 | 1.74 | 1.20 | 0.74 |
| Total (Case 2) | 2.50 (22% ↓) | 1.59 (27% ↓) | 1.20 (31% ↓) | 0.76 (37% ↓) | 0.41 (51% ↓) |

Here, "Case 1" represents a semiconductor device in which P pillars and N pillars are alternately arranged along the first direction X in the termination region TR, and "Case 2" represents a semiconductor device described in relation to FIG. 2. In the case of "Case 2", the reduction effect of the Edyn is 0.41 μJ, indicating a 51% reduction effect compared to 0.74 μJ of "Case 1".

The Edyn stands for "Dynamic Eoss Capacitance Loss". In a case of a super junction MOSFET, a loss occurs during a charge/discharge process of a Coss capacitor (an output capacitor) during a switching operation, and an on/off switching energy loss occurring at this time may be referred to as Edyn. For the Edyn, as the concentration of the charged impurity present in the Coss capacitor increases, the number of carriers moving during the charge/discharge process increases, resulting in increasing heat generation and energy loss, thereby increasing in the Edyn. Therefore, in order to reduce the Edyn, it is necessary to design the device so that the concentration of the charged impurities is minimized, and the effect of reducing Edyn may be obtained according to the design method of the termination region of the semiconductor device according to the embodiment.

Figure 8:
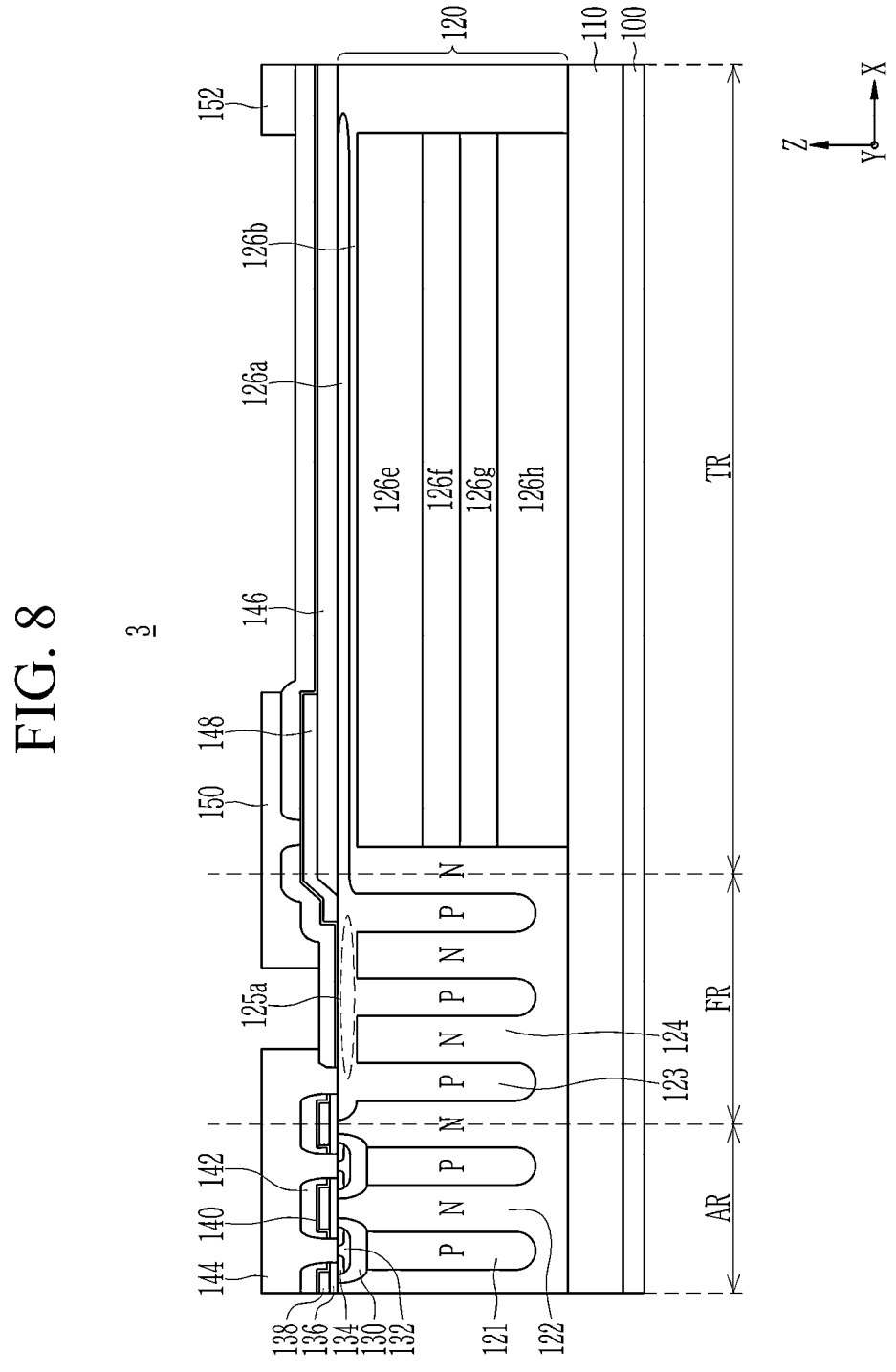
FIG. 8 is a cross-sectional view for explaining a semiconductor device according to an embodiment.

FIG. 8 is a cross-sectional view for explaining a semiconductor device according to an embodiment.

Referring to FIG. 8, the semiconductor device 3 according to an embodiment may include a first semiconductor layer 110 and a second semiconductor layer 120. Referring to FIG. 1, each of the above-described active region AR, frame region FR, and termination region TR may include the first semiconductor layer 110 and the second semiconductor layer 120. Here, for the active region AR and the frame region FR, the description described above in relation to FIG. 2 may be referred to.

The termination region TR of the second semiconductor layer 120 may be formed to surround the frame region FR of the second semiconductor layer 120.

The termination region TR of the second semiconductor layer 120 may include a first surface termination layer 126a, a second surface termination layer 126b, a first low-concentration termination layer 126e, a second low-concentration termination layer 126f, a third low-concentration termination layer 126g, and a fourth low-concentration termination layer 126h.

The first surface termination layer 126a may have a P conductivity type and may be formed to extend in the first direction X). The second surface termination layer 126b may have an N conductivity type and be formed to extend in the first direction X, and may be formed below the first surface termination layer 126a. In some embodiments, the doping concentration of the first surface termination layer 126a and the doping concentration of the second surface termination layer 126b may be the same or substantially the same. In the stacked structure of the first surface termination layer 126a and the second surface termination layer 126b, an upper region corresponding to the first surface termination layer 126a may correspond to a P-rich region, and a lower region corresponding to the second surface termination layer 126b may correspond to an N-rich region.

The first low-concentration termination layer 126e may have a P conductivity type and be formed to extend in the first direction X, and may be formed below the second surface termination layer 126b. The second low-concentration termination layer 126f may have an N conductivity type and be formed to extend in the first direction X, and may be formed below the first low-concentration termination layer 126e. In some embodiments, the doping concentration of the first low-concentration termination layer 126e and the doping concentration of the second low-concentration termination layer 126f may be the same or substantially the same. In the stacked structure of the first low-concentration termination layer 126e and the second low-concentration termination layer 126f, an upper region corresponding to the first low-concentration termination layer 126e may correspond to a P-rich region, and a lower region corresponding to the second low-concentration termination layer 126f may correspond to an N-rich region.

In some embodiments, the doping concentration of the first low-concentration termination layer 126e may be lower than the doping concentration of the first surface termination layer 126a or the doping concentration of the second surface termination layer 126b. Also, the doping concentration of the second low-concentration termination layer 126f may be lower than the doping concentration of the first surface termination layer 126a or the doping concentration of the second surface termination layer 126b.

In some embodiments, the thickness of the first low-concentration termination layer 126e may be thicker than the thickness of the first surface termination layer 126a or the thickness of the second surface termination layer 126b. Also, the thickness of the second low-concentration termination layer 126f may be thicker than the thickness of the first surface termination layer 126a or the thickness of the second surface termination layer 126b. Meanwhile, the thickness of the first low-concentration termination layer 126e may be thicker than the thickness of the second low-concentration termination layer 126f.

The third low-concentration termination layer 126g has a P conductivity type and is formed to extend in the first direction X, and may be formed below the second low-concentration termination layer 126f. The fourth low-concentration termination layer 126h has an N conductivity type and is formed to extend in the first direction X, and may be formed below the third low-concentration termination layer 126g. In some embodiments, the doping concentration of the third low-concentration termination layer 126g and the doping concentration of the fourth low-concentration termination layer 126h may be the same or substantially the same. In the stacked structure of the third low-concentration termination layer 126g and the fourth low-concentration termination layer 126h, an upper region corresponding to the third low-concentration termination layer 126g may correspond to a P-rich region, and a lower region corresponding to the fourth low-concentration termination layer 126h may correspond to an N-rich region.

In some embodiments, the doping concentration of the third low-concentration termination layer 126g may be lower than the doping concentration of the first surface termination layer 126a or the doping concentration of the second surface termination layer 126b. Also, the doping concentration of the fourth low-concentration termination layer 126h may be lower than the doping concentration of the first surface termination layer 126a or the doping concentration of the second surface termination layer 126b.

In some embodiments, the thickness of the third low-concentration termination layer 126g may be greater than the thickness of the first surface termination layer 126a or the thickness of the second surface termination layer 126b. Also, the thickness of the fourth low-concentration termination layer 126h may be thicker than the thickness of the first surface termination layer 126a or the thickness of the second surface termination layer 126b. Meanwhile, the thickness of the third low-concentration termination layer 126g may be thinner than the thickness of the fourth low-concentration termination layer 126h.

In some embodiments, the thickness of the first low-concentration termination layer 126e may be the same or substantially the same as the thickness of the fourth low-concentration termination layer 126h, and the thickness of the second low-concentration termination layer 126f may be equal to or substantially equal to the thickness of the third low-concentration termination layer 126g.

In the present embodiment, the second surface termination layer 126b, the first low-concentration termination layer 126e, the second low-concentration termination layer 126f, the third low-concentration termination layer 126g, and the fourth low-concentration termination layer 126h may be covered by the first surface termination layer 126a. That is, the first surface termination layer 126a may be formed to entirely cover the upper surface of the termination region TR.

In the present embodiment, the termination region TR, instead of the layout of the third P pillar 127 and the third N pillar 128 as described in FIG. 1, may adopt the layout of the first surface termination layer 126a, the second surface termination layer 126b, the first low-concentration termination layer 126e, the second low-concentration termination layer 126f, the third low-concentration termination layer 126g, and the fourth low-concentration termination layer 126h stacked vertically with each other, thereby minimizing the energy loss that occurs during the on/off operation of the semiconductor device.

FIG. 9 to FIG. 14 are views showing an improvement effect on a charge pocket according to a drain voltage in a semiconductor device according to embodiments.

Figure 9:
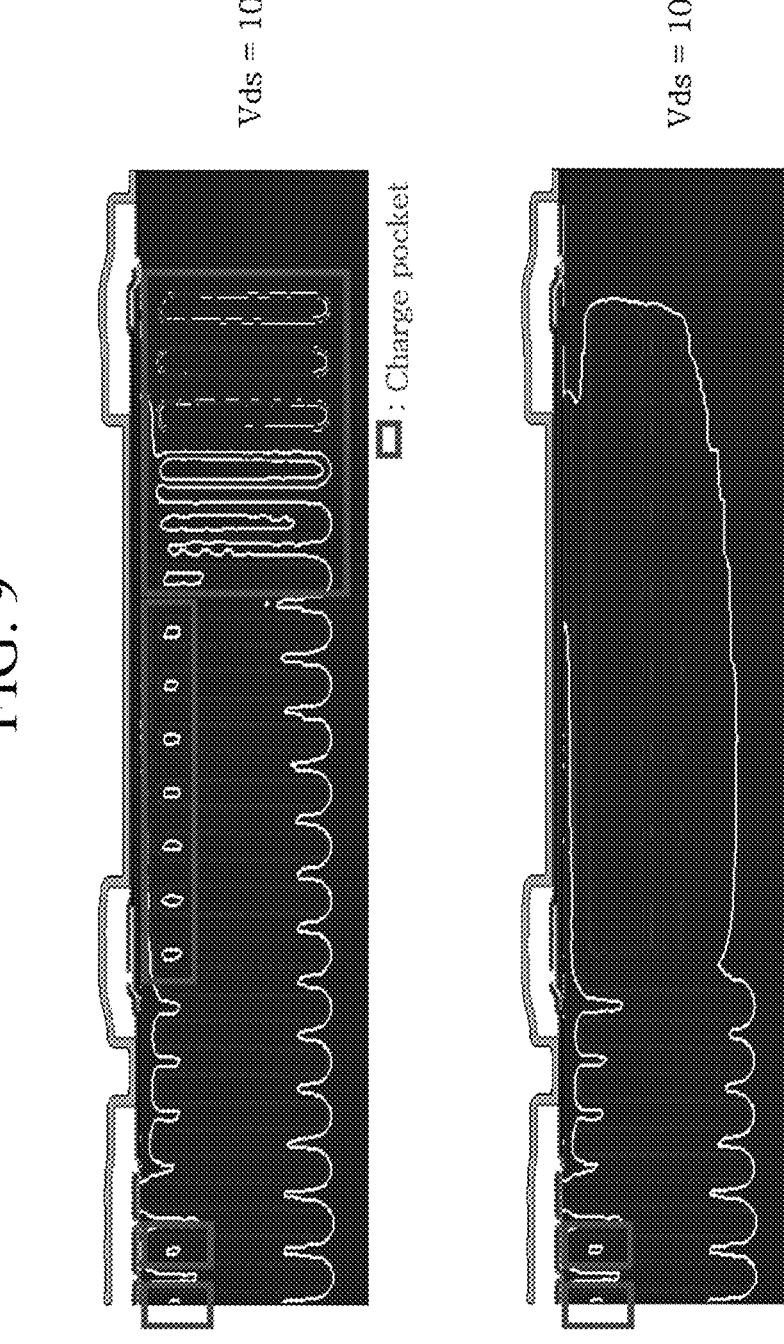
FIG. 9 to FIG. 14 are views showing an improvement effect on a charge pocket according to a drain voltage in a semiconductor device according to embodiments.

Referring to FIG. 9, when Vds is 100 V, a semiconductor device (an upper part, Case 1) formed with a P pillar and an N pillar alternately arranged along a first direction X in a termination region TR and a semiconductor device (a lower part, Case 2) described in relation to FIG. 2 are shown. It may be confirmed that, in "Case 1", a charge pocket exists in the active region and the termination region, and the amount of the remaining charge pockets increases toward the end of particularly termination, however, in "Case 2", the charge pocket exists only in the active region and it does not exist in the termination region.

Figure 10:
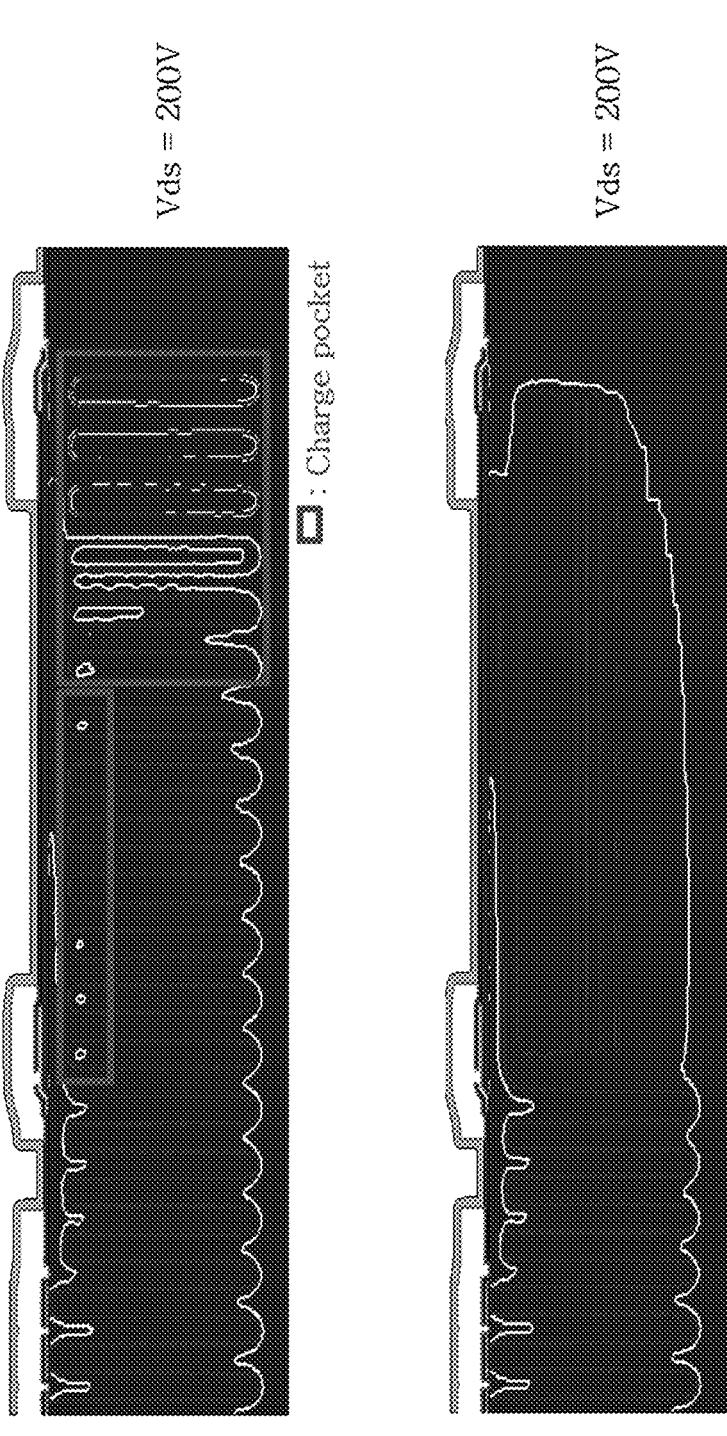
Figure 11:
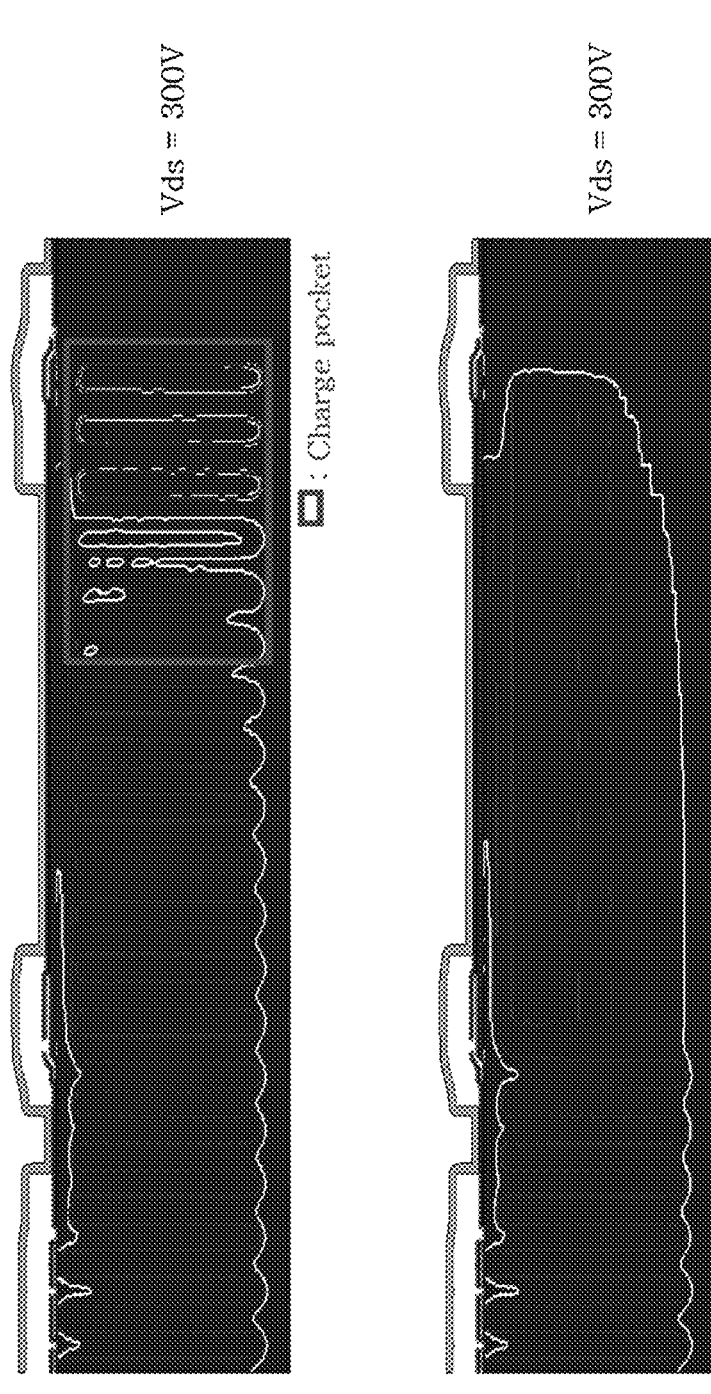
Figure 12:
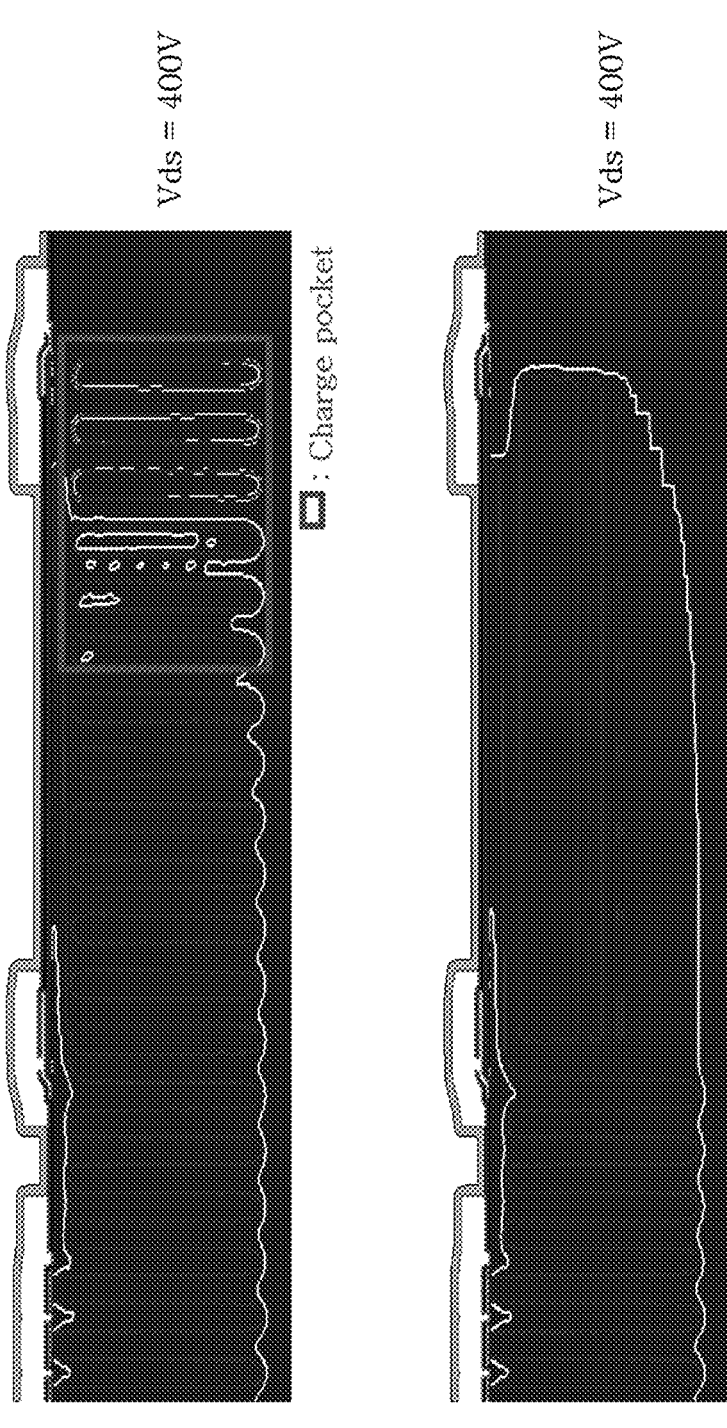
Figure 13:
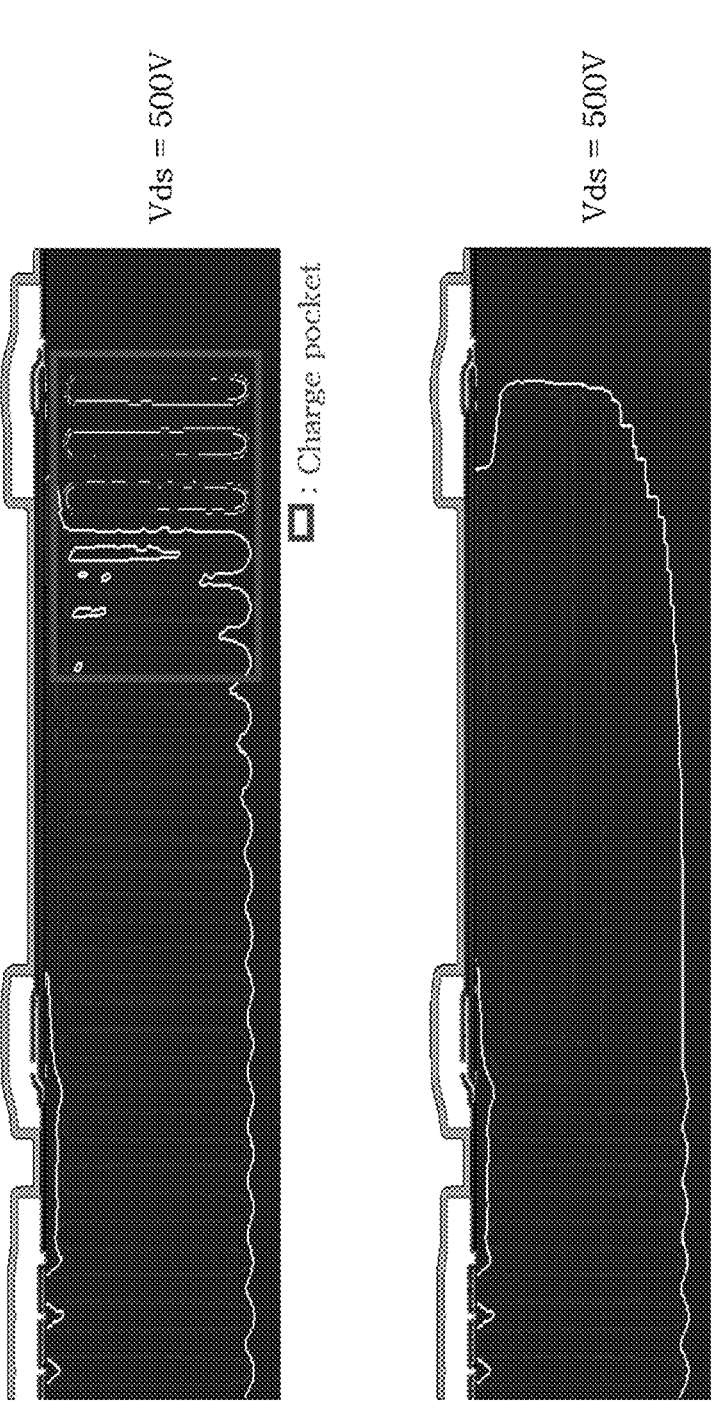
Figure 14:
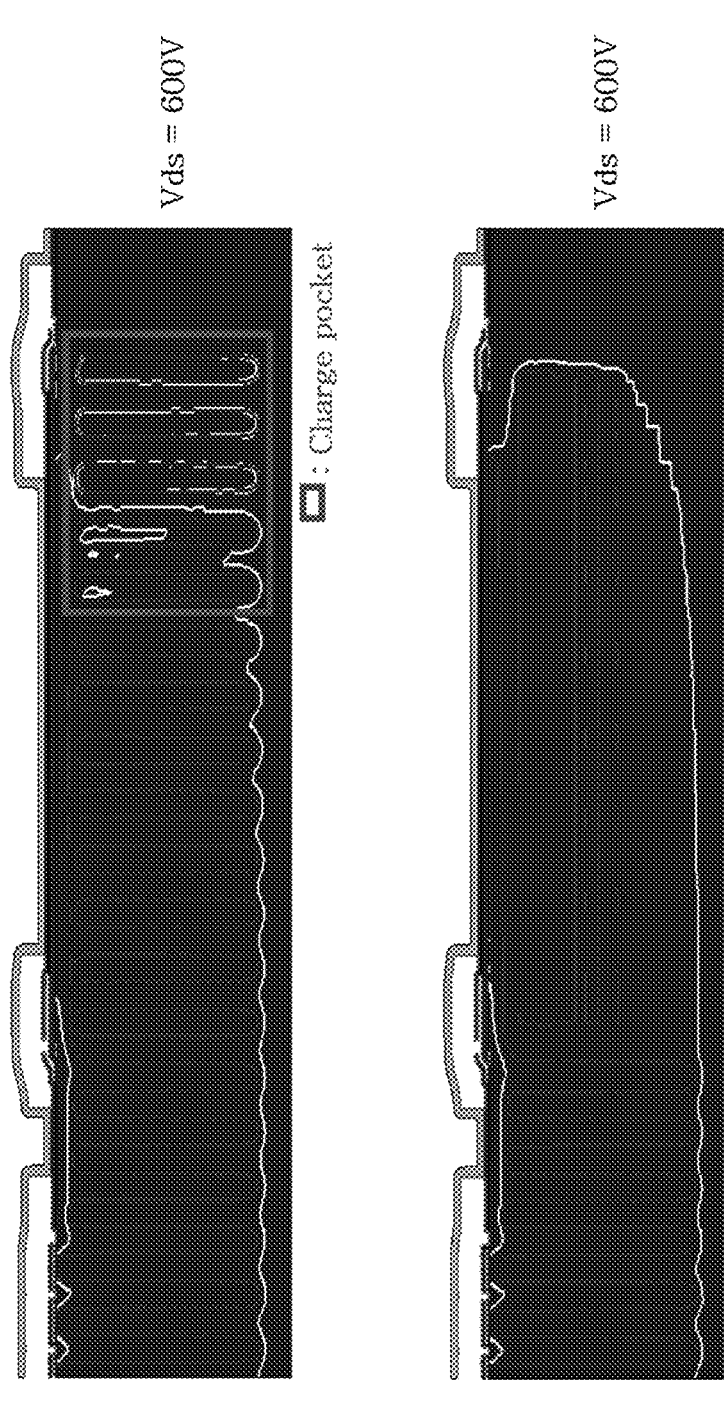

Referring to FIG. 10, when Vds is 200 V, it may be confirmed that, in "Case 1", the charge pocket of the active region has disappeared, but the charge pocket still exists in the termination region, and in the case of "Case 2", the charge pocket does not exist in either of the active region or the termination region.

Referring to FIG. 11 to FIG. 14, when Vds increases to 300 V, 400 V, 500 V, and 600 V, it may be confirmed that, in "Case 1", the charge pocket exists in the termination region, but in the case of "Case 2", the charge pocket does not exist in either of the active region or the termination region.

According to the embodiments described so far, instead of the layout of the third P pillar 127 and the third N pillar 128 as described in FIG. 1, the layout of the first surface termination layer 126a, the second surface termination layer 126b, the first low-concentration termination layer 126c, and the second low-concentration termination layer 126d stacked vertically on each other, or the structure of the first surface termination layer 126a, the second surface termination layer 126b, the first low-concentration termination layer 126e, the second low-concentration termination layer 126f, the third low-concentration termination layer 126g, and the fourth low-concentration termination layer 126h may be adopted, and accordingly, the concentration of the charged impurities is minimized and the Edyn is reduced, thereby minimizing the energy loss during an on/off operation of semiconductor devices.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A semiconductor device comprising:
a first semiconductor layer having an N conductivity type; and
a second semiconductor layer formed on the first semiconductor layer and including an active region, a frame region, and a termination region,
wherein the active region includes a plurality of first P pillars and first N pillars formed between the plurality of first P pillars, and the frame region includes a plurality of second P pillars and second N pillars formed between the plurality of second P pillars,
the termination region includes a first surface termination layer having a P conductivity type and formed to extend in a first direction, a second surface termination layer having an N conductivity type and formed to extend in the first direction under the first surface termination layer, a first low-concentration termination layer having a P conductivity type and formed to extend in the first direction under the second surface termination layer, and a second low-concentration termination layer having an N conductivity type and formed in the first direction under the first low-concentration termination layer, and the first surface termination layer is formed on a top surface of the second semiconductor layer in the termination region.

2. The semiconductor device of claim 1, wherein the doping concentration of the first low-concentration termination layer and the doping concentration of the second low-concentration termination layer are lower than the doping concentration of the first surface termination layer or the doping concentration of the second surface termination layer.

3. The semiconductor device of claim 1, wherein the second surface termination layer, the first low-concentration termination layer, and the second low-concentration termination layer are covered by the first surface termination layer.

4. The semiconductor device of claim 1, wherein the thicknesses of the first low-concentration termination layer and the thickness of the second low-concentration termination layer are thicker than the thickness of the first surface termination layer or the thickness of the second surface termination layer.

5. The semiconductor device of claim 1, wherein the semiconductor device is manufactured using a mask layer so that the distance between the centers of the first pillar mask patterns in the termination region is smaller than the distance between the centers of the first pillar mask patterns in the active region, and the distance between the centers of the second pillar mask patterns in the termination region is smaller than the distance between the centers of the second pillar mask pattern in the active region.

6. The semiconductor device of claim 1, wherein the doping concentration of the second P pillar increases as it approaches the upper end of the second semiconductor layer and decreases as it approaches the lower end of the second semiconductor layer, and the doping concentration of the second N pillar increases as it approaches the upper end of the second semiconductor layer and decreases as it approaches the lower end of the second semiconductor layer.

* * * * *